(12) United States Patent
Kojima

(10) Patent No.: US 8,289,384 B2
(45) Date of Patent: Oct. 16, 2012

(54) ELECTRON BEAM DISPLACEMENT MEASURING METHOD, ELECTRON BEAM DISPLACEMENT MEASURING DEVICE, AND ELECTRON BEAM RECORDING APPARATUS

(75) Inventor: Yoshiaki Kojima, Saitama (JP)

(73) Assignee: NuFlare Technology, Inc., Numazu-shi (JP)

( * ) Notice: Subject to any disclaimer, the term of this patent is extended or adjusted under 35 U.S.C. 154(b) by 1693 days.

(21) Appl. No.: 11/587,932

(22) PCT Filed: Jun. 2, 2005

(86) PCT No.: PCT/JP2005/010144
§ 371 (c)(1),
(2), (4) Date: Oct. 26, 2006

(87) PCT Pub. No.: WO2005/121902
PCT Pub. Date: Dec. 22, 2005

(65) Prior Publication Data
US 2007/0216767 A1    Sep. 20, 2007

(30) Foreign Application Priority Data
Jun. 7, 2004    (JP) ................................ 2004-168062

(51) Int. Cl.
*H04N 9/47*    (2006.01)
(52) U.S. Cl. .......... 348/80; 250/491.1; 250/310; 348/79
(58) Field of Classification Search .................... 348/79, 348/80; 250/310, 491.1; 382/128, 276; 359/385–390
See application file for complete search history.

(56) References Cited

U.S. PATENT DOCUMENTS

| 6,476,382 | B1 * | 11/2002 | Zhai et al. ................. 250/237 G |
| 6,559,934 | B1 * | 5/2003 | Yee et al. ...................... 356/121 |
| 6,586,753 | B2 * | 7/2003 | Wada .......................... 250/491.1 |
| 6,618,218 | B1 * | 9/2003 | Kadowaki et al. .......... 360/77.03 |
| 6,754,162 | B2 * | 6/2004 | Fujita et al. ............. 369/112.05 |
| 6,917,048 | B2 * | 7/2005 | Fujiwara et al. .......... 250/492.22 |
| 2003/0071230 | A1 * | 4/2003 | Wada .......................... 250/491.1 |
| 2003/0077530 | A1 * | 4/2003 | Fujiwara et al. ................ 430/30 |
| 2003/0128348 | A1 * | 7/2003 | Nishi .............................. 355/53 |
| 2004/0066557 | A1 * | 4/2004 | Anikitchev et al. ........... 359/618 |

FOREIGN PATENT DOCUMENTS

JP    55-078451 A    6/1980
(Continued)

*Primary Examiner* — Haresh N Patel
(74) *Attorney, Agent, or Firm* — Oblon, Spivak, McClelland, Maier & Neustadt, L.L.P.

(57) ABSTRACT

It is an object of the present invention to make it possible to stably and correctly measure a changing amount of a beam position when a beam displacement is measured prior to a recording operation performed by an electron beam recording apparatus. A measuring device for measuring a displacement of an electron beam prior to a recording operation, comprises: a knife edge disposed at an irradiating position of the beam spot; detecting means (Farady cup or the like) for detecting an electron beam irradiating through the knife edge; filter means (high frequency cut filter or the like) for removing a changing frequency component of measurement subject from an output of the detecting means; and control means for controlling a reference position of the electron beam in accordance with an output from the filter means, in a manner such that the center of the beam spot will be at the front end position of the knife edge. A displacement of the beam spot is measured in accordance with an output change of the detecting means when the center of the beam spot deviates from the front end of the knife edge.

3 Claims, 4 Drawing Sheets

FOREIGN PATENT DOCUMENTS

| | | |
|---|---|---|
| JP | 60-117721 A | 6/1985 |
| JP | 61-193345 A | 8/1986 |
| JP | 11-016815 A | 1/1999 |
| JP | 2002-367241 A | 12/2002 |

* cited by examiner

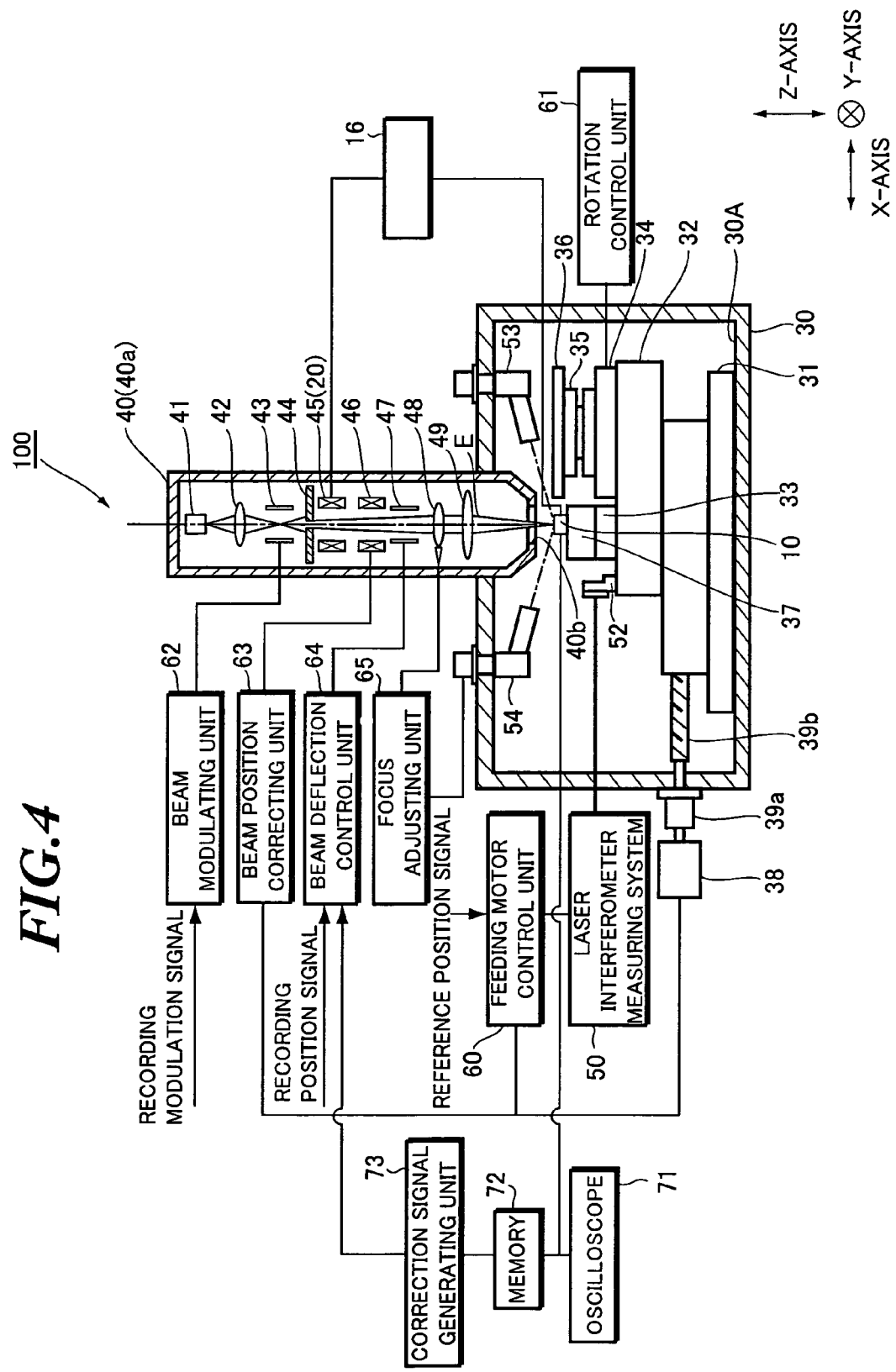

ELECTRON BEAM DISPLACEMENT MEASURING METHOD, ELECTRON BEAM DISPLACEMENT MEASURING DEVICE, AND ELECTRON BEAM RECORDING APPARATUS

CROSS-REFERENCE TO RELATED APPLICATION

This application is a National Stage entry of International Application No. PCT/JP2005/010144 filed Jun. 2, 2005, which claims benefit of Japan Application No. 2004-168062 filed Jun. 7, 2004, the entire specification claims and drawings of which are incorporated herewith by reference.

TECHNICAL FIELD

The present invention relates to an electron beam displacement measuring method, an electron beam displacement measuring device, and an electron beam recording apparatus.

TECHNICAL BACKGROUND

An electron beam recording apparatus (EBR) is used to manufacture an original disc for producing optical information recording medium, optical-magnetic information recording medium, phase-change information recording medium, and magnetic information recording medium. An electron beam recording apparatus is also used to form wiring pattern(s) for arranging integrated circuit elements. In use, an electron beam recording apparatus applies a converged electron beam to a recording object such as an original disc to form a recording pattern thereon.

When information is to be recorded in optical information recording medium (such as optical disc), it is necessary to prepare an original disc to record in its concave or convex tracks (groove tracks or land tracks) rotation control information such as wobbling signal or the like for controlling the rotation of an optical disc or address information needed for searching position during data recording. When concave-convex pattern corresponding to the signals is to be recorded in an original disc, a conventional method is to apply a converged beam spot to a recording surface. However, in order to form a fine (small) track pitch to satisfy a high density recording required by an optical recording medium, there has been in use another recording method which utilizes an electron beam having a smaller spot size than a laser beam and capable of obtaining a high recording resolution.

The following Patent Document 1 has disclosed an electron beam recording apparatus capable of producing a high density original (optical) disc. Such an electron beam recording apparatus is suitable for recording signals in concentric tracks of an original disc, while the apparatus itself comprises a rotation driving section which supports and rotates an original disc having formed thereon a resist layer, an electron beam emitting section for deflectably applying an electron beam to an original disc to form a beam spot thereon, and a relative movement driving section for relatively driving in parallel the rotation driving section and the beam spot in the radial direction of the original disc.

However, the above-mentioned electron beam recording apparatus requires its electron beam to be adjusted prior to its recording operation. This is because an electron beam is apt to receive an influence from a magnetic field of a surrounding environment. When a beam vibrates due to an influence from a magnetic field, a recording precision will drop. On the other hand, it is impossible to branch an electron beam like a laser beam during a recording operation to monitor a beam position and a beam state while the recording is going on. Moreover, when an electron beam is adjusted, it is necessary to measure a change in beam position, a size of a focusing spot of the beam, so as to adjust the beam at a time of recording in accordance with a measurement result.

FIG. 1 shows a conventional system for measuring a beam displacement during an electron beam measurement prior to a recording operation. As shown, a knife edge N is disposed in a spot position of a converged electron beam E so as to block a half of the beam spot. An electric current arriving at a Farady cup F through the knife edge N is amplified by a current amplifier A and then outputted to an oscilloscope O, thereby measuring a beam displacement with respect to the electron beam E.

Patent Document 1: Japanese Unexamined Patent Application Publication No. 2002-367241.

DISCLOSURE OF THE INVENTION

Problem(s) to be Solved by the Invention

When measuring a beam displacement with respect to an electron beam, it will be effective to measure a change in an external magnetic field with respect to a high frequency component. This is because a high frequency change has a considerable influence on a recording operation which is required to have a high resolution. For this reason, in order to ensure a high precision recording, it is necessary to correctly measure an amount of the aforementioned change or take measure to reduce or correct such a change.

Further, in order to measure a change in the beam position with an acceptable precision, it is necessary to correctly decide a reference position for a beam spot with respect to a knife edge. By correctly disposing the knife edge to block a half of the beam spot, it is possible to detect a change in the position of a beam spot with a high precision by observing a change in a detected current when the center of the beam spot deviates from the front end of the knife edge.

At this time, a spot size of an electron beam for recording information in an optical information recording medium is in an order of several nm(s) to several tens of nm(s). When the center of a beam spot of an electron beam serving as a reference deviates from the front end of the knife edge, a rate of displacement to current change will vary undesirably, rendering it impossible to ensure a correct measurement. Moreover, when the beam spot goes completely away from the knife edge or is blocked by the knife edge so that the beam spot will drift from a measurable range (a beam spot size of several nm(s) to several tens of nm(s) is a measurement range), it will become impossible to measure the displacement. As a result, when there is a drift having a large width at a relatively low frequency, the above-discussed prior art will fail to stably and correctly measure a displacement of an electron beam.

The present invention is to solve the above-discussed problem and makes this as one of its tasks. Namely, it is an object of the present invention to make it possible to stably and correctly measure a changing amount of a beam position when a beam displacement is measured prior to a recording operation performed by an electron beam recording apparatus.

Means for Solving the Problem

In order to achieve the foregoing object, an electron beam displacement measuring method, an electron beam displacement measuring device, and an electron beam recording apparatus, all formed according to the present invention, have at least the following constitutions.

An electron beam displacement measuring method for use in an electron beam recording apparatus where a beam spot of an electron beam is converged on a recording surface to form a recording pattern on the recording surface, said method comprising: disposing a knife edge at an irradiating position of the beam spot; detecting an electron beam irradiating through the knife edge; measuring a displacement of the beam spot in accordance with a change in a detected current when a center of the beam spot deviates from a front end of the knife edge. At this time, a reference position of the electron beam during said measuring is controlled in a manner such that the center of the beam spot will be at the front end position of the knife edge.

An electron beam displacement measuring device for use in an electron beam recording apparatus where a beam spot of an electron beam is converged on a recording surface to form a recording pattern on the recording surface, said measuring device being provided for measuring a displacement of the electron beam prior to a recording operation and comprising: a knife edge disposed at an irradiating position of the beam spot; detecting means for detecting an electron beam irradiating through the knife edge; filter means for removing a changing frequency component of measurement subject from an output of the detecting means; and control means for controlling a reference position of the electron beam in accordance with an output from the filter means, in a manner such that the center of the beam spot will be at the front end position of the knife edge. In particular, a displacement of the beam spot is measured in accordance with an output change of the detecting means when the center of the beam spot deviates from the front end of the knife edge.

An electron beam recording apparatus where in a beam spot of an electron beam is converged on a recording surface to form a recording pattern on the recording surface. The recording apparatus is provided with a measuring device for measuring a displacement of the electron beam prior to a recording operation. The measuring device comprises: a knife edge disposed at an irradiating position of the beam spot; detecting means for detecting an electron beam irradiating through the knife edge; filter means for removing a changing frequency component of measurement subject from an output of the detecting means; and control means for controlling a reference position of the electron beam in accordance with an output from the filter means, in a manner such that the center of the beam spot will be at the front end position of the knife edge. In particular, a displacement of the beam spot is measured in accordance with an output change of the detecting means when the center of the beam spot deviates from the front end of the knife edge.

BRIEF DESCRIPTION OF THE DRAWINGS

FIG. 4 is an explanatory view showing an electron beam recording apparatus formed according to an embodiment of the present invention.

BEST MODE OF CARRYING OUT THE INVENTION

Figure 1:
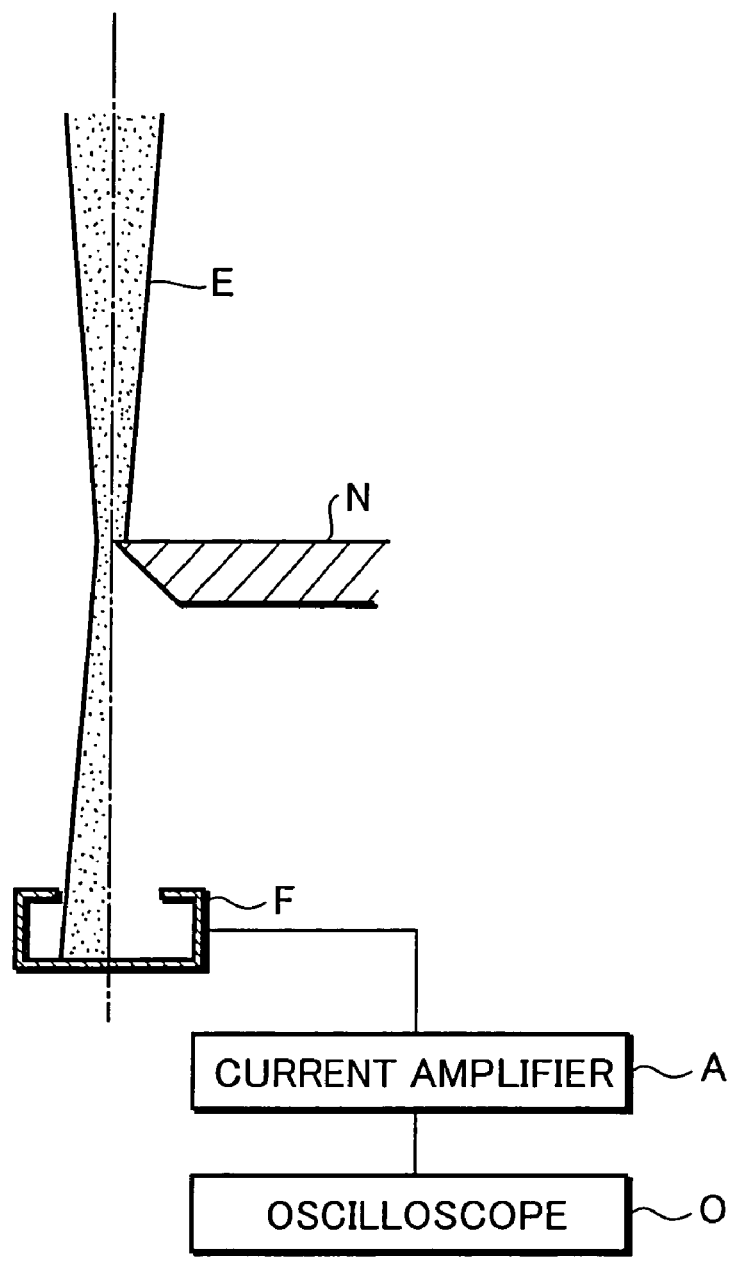
FIG. 1 is an explanatory view showing a prior art.
Figure 2:
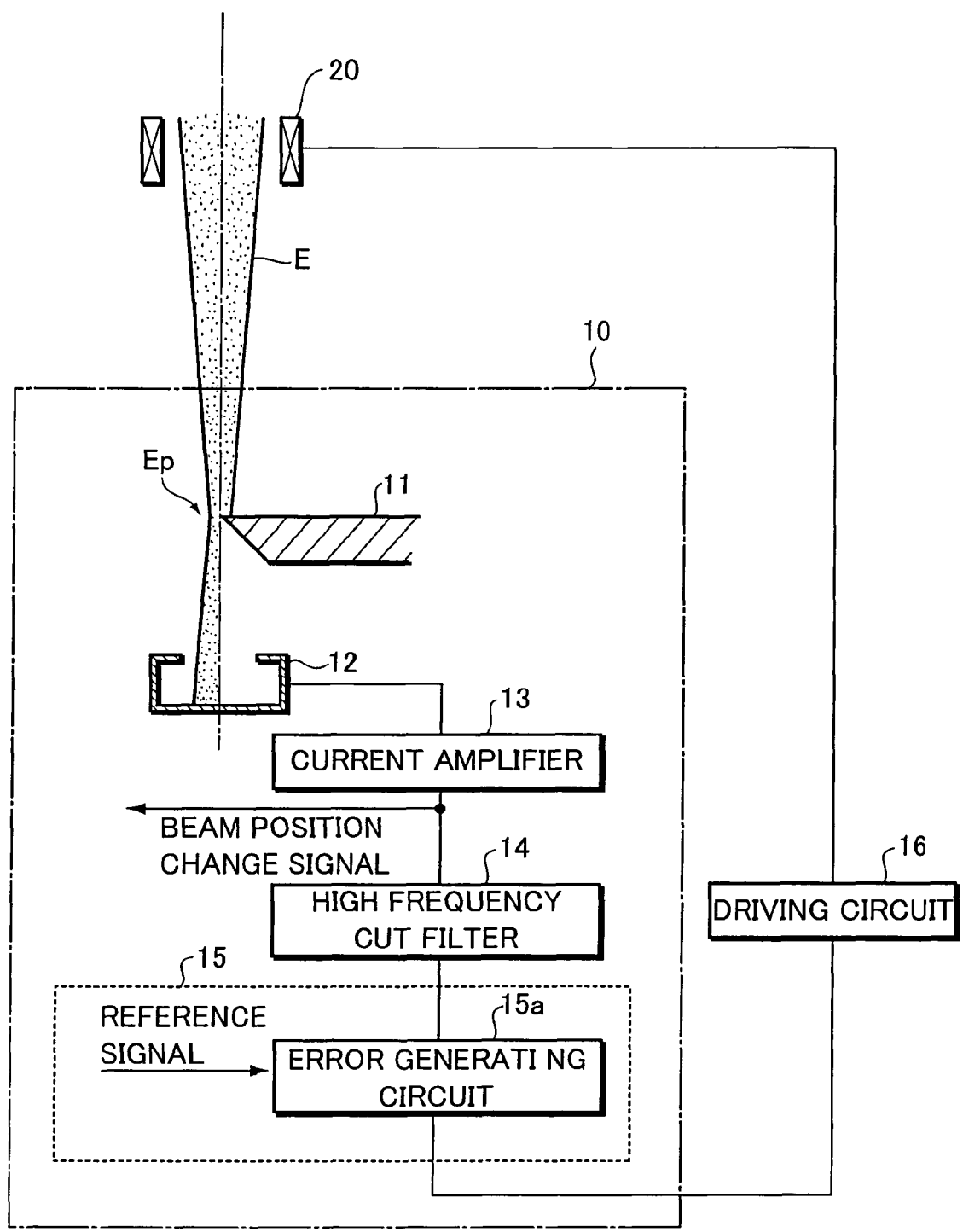
FIG. 2 is an explanatory view showing an electron beam displacement measuring method and an electron beam displacement measuring device according to an embodiment of the present invention.

In the following, an embodiment of the present invention will be described with reference to the accompanying drawings. FIG. 2 is an explanatory view showing an electron beam displacement measuring method and an electron beam displacement measuring device according to an embodiment of the present invention.

With respect to an electron beam recording apparatus (not shown) for converging a beam spot $E_P$ of an electron beam E on a recording surface to form a recording pattern on the recording surface, a measuring device 10 operates to measure a displacement of the electron beam E prior to a recording operation. The measuring device comprises, as essential elements, a knife edge 11 disposed at an irradiating position of the beam spot $E_p$, a Farady cup (detecting means) 12 for detecting an electron beam irradiating through the knife edge 11, a high frequency cut filter (filter means) 14 for removing a changing frequency component of measurement subject from an output of the Farady cup 12, and control means 15 for controlling a reference position of the electron beam E in accordance with an output of the high frequency cut filter 14, in a manner such that the center of the beam spot $E_p$ will be at the front end of the knife edge 11.

In more detail, if necessary, an output of the Farady cup 12 is amplified by a current amplifier 13, while a changing frequency component of measurement subject is removed from an amplified output by virtue of the high frequency cut filter 14. Then, an output not containing a high frequency component is inputted into an error generating circuit 15a partially forming the control means 15, so as to be compared with a reference signal, thereby outputting an error signal. Subsequently, a driving signal is outputted from a driving circuit 16 by virtue of the error signal, so as to drive a deflecting coil 20, thereby controlling a reference position of the electron beam E in a manner such that the center of the beam spot $E_P$ will be at the front end of the knife edge 11.

In this way, it is possible to measure a displacement of the beam spot $E_P$ by virtue of an output change of the Farady cup 12 when the center of the beam spot $E_P$ deviates from the front end of the knife edge 11. That is, under a condition in which the deflecting coil 20 controls a reference position of the electron beam E in accordance with an output signal from the driving circuit 16, an output from the Farady cup 12 will be amplified by the current amplifier 13 and outputted as a beam displacement signal. The beam displacement signal is outputted to an oscilloscope in the same manner as a prior art so as to observe a changing state. Further, the beam displacement signal or an output from the Farady cup 12 is stored in a memory, thereby making it possible to generate a correction signal during a recording operation.

Figure 3:
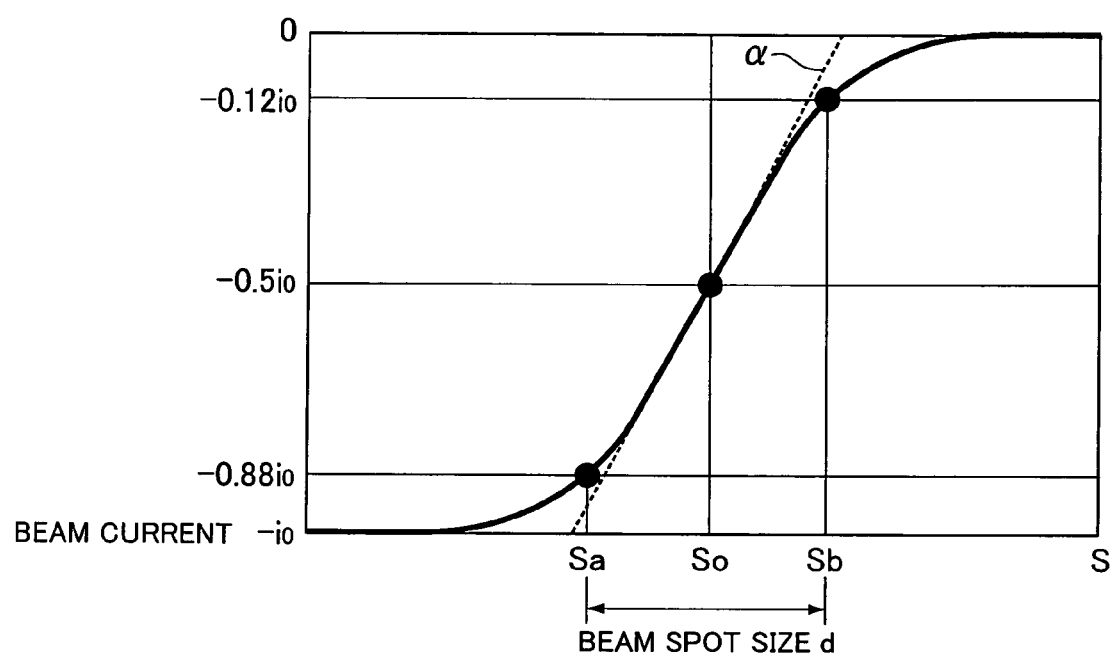
FIG. 3 is a graph showing a relationship between a position S of a beam spot $E_p$ and a detected current in an electron beam displacement measuring device according to an embodiment of the present invention.

FIG. 3 is a graph showing a relationship between a position S of a beam spot $E_p$ and a detected current. By ensuring a reference position $S_o$ which allows the center of the beam spot $E_P$ to be at the front end of the knife edge 11, if a detected current of the electron beam is at $i_0$, and if a beam spot position $S_a$ when a detected current is $-0.88i_0$ as well as another beam spot position $S_b$ when a detected current is $-0.12i_0$ are found, it is possible to find a beam spot diameter d in accordance with $|S_b-S_a|$, and to find a detection sensitivity $\alpha$ in accordance with $\alpha=2\{(\pi/\ln 2)\cdot(i_0/d)\}^{1/2}$. In this way, by virtue of an output difference with respect to $-0.5i_0$ as well as a detection sensitivity $\alpha$, it is possible to find a changing amount of beam position with a high precision.

According to the measuring device 10 and the measuring method using the measuring device, when a displacement of the beam spot $E_P$ is measured, it is possible to control a reference position of the electron beam E in a manner such that the center of the beam spot $E_P$ will be positioned at the front end of the knife edge 11. As a result, it becomes possible to constantly and stably measure a changing amount without causing the electron beam E to deviate from a measurement range during a measurement.

Further, by setting a changing frequency band for controlling a reference position of an electron beam at a low frequency like a drift, it is possible to correctly measure a beam displacement in a frequency band equal to or higher than the preset frequency band. More specifically, by setting a cut-off frequency at a value of about several Hz(s), it is possible to correctly measure a change in a commercial power supply frequency (50 Hz) or a switching frequency (several 10 kHz) of a power source. In this way, it is possible to effectively measure a beam displacement in an electron beam recording apparatus which performs a recording having a high resolution.

FIG. 4 is an explanatory view showing an electron beam recording apparatus 100 equipped with the above-described measuring device 10. The electron beam recording apparatus 100 comprises a vacuum chamber 30, and an electron beam emitting section 40 attached to the vacuum chamber 30, and various control units. Since the electron beam E has a property of attenuating in an atmosphere of an atmospheric air, an exposure treatment of the electron beam is carried out within the vacuum atmosphere in the vacuum chamber 30. Further, a vacuum pump (not shown) is connected to the vacuum chamber 30 to evacuate the chamber, thereby setting the vacuum chamber 30 at a predetermined vacuum condition of a predetermined pressure. In general, the vacuum chamber 30 is installed on a floor through a vibration-proof pedestal (not shown) such as an air damper, so that it is possible to prevent an external vibration from propagating into the vacuum chamber 30 or the electron beam emitting section 40 installed on the vacuum chamber 30.

An internal structure of the vacuum chamber 30 can be described as follows. Namely, a feeding table 31 is provided on a bottom surface 30A, and an X-axis feeding stage 32 is provided on the feeding table 31 so as to be movable in the X-axis direction (one of the two mutually orthogonal axes). A spindle motor 34 for turning the turn-table 35 by virtue of the rotation control unit 61 is disposed on the X-axis feeding stage 32. A recording object 36 such as an original disc is mounted on the turn-table 35.

Moreover, Y-axis feeding stage 33 and a vertical stage 37 are disposed on the X-axis feeding stage 32, while the above-described measuring device 10 is disposed on the vertical stage 37. Subsequently, a positional adjustment in X, Y, Z directions is carried out by means of the X-axis feeding stage 32, the Y-axis feeding stage 33 and the vertical stage 37, in a manner such that the top surface of the knife edge 11 and the recording surface of the recording object 36 will be at the same level.

On the other hand, although an adjustment of the X-axis feeding stage 32 is carried out by a rotational driving of a feeding motor 38 and feeding mechanisms 39a and 39b, such an adjustment also employs a laser interferometer measuring system 50. Based on the measurement data obtained by using the laser interferometer measuring system 50, it is possible to control the feeding motor 38 by an output from a feeding motor control unit 60, thereby effecting a desired adjustment. In more detail, the measurement data obtained by the laser interferometer measuring system 50 is compared with a reference position signal by the motor control unit, thus effecting a driving control of the feeding motor 38 by a control signal corresponding to a difference found by such a comparison, thereby setting a position for the X-axis feeding stage 32 in response to the reference position signal.

Next, description will be given to explain the electron beam emitting section 40. Namely, various elements are disposed within an electron beam column 40a, including an electron gun 41, a converging lens 42, blanking electrodes 43, a modulation aperture 44, a deflecting coil 45, an alignment coil 46, a high-speed deflecting device 47, a focus adjusting lens 48, and an objective lens 49, which are arranged from the top to the bottom.

The electron gun 41 is provided for emitting an electron beam E accelerated by a high voltage of several 10 keV(s) from an acceleration high voltage power supply (not shown), while the emitted electron beam E is converged by the converging lens 42, passed between the blanking electrodes 43 and then guided to the modulation aperture 44. The blanking electrodes 43 are controlled by a beam modulating unit 62, and performs an intensity modulation of the electron beam E based on a recording modulation signal inputted at the time of recording. That is, the beam modulating section 62 applies an output voltage corresponding to a recording modulation signal between the blanking electrodes 43, so as to greatly deflect the electron beam E passing therethrough. In this way, the electron beam E is On-Off controlled when passing through the modulation aperture 44 or intercepted by the modulation aperture 44, thereby effecting a desired modulation of the electron beam E.

The deflecting coil 45 is an equivalent to the deflecting coil 20 shown in FIG. 2, and controls the electron beam E at its reference position in accordance with an output from the measuring device 10. The alignment coil 46 is driven by an output based on a position error signal from the feeding motor control unit 60 and fed from a beam position correcting unit 63, thereby correcting the position of the electron beam E. The high-speed deflecting device 47 is driven by an output fed from a beam deflection control unit 64 and based on a recording position signal to be inputted during a recording operation, thereby effecting a high speed deflection control on the electron beam E.

The focus adjusting lens 48, cooperating with the objective lens 49, forms a beam spot $E_P$ on an upper surface level of the knife edge 11 when measuring a beam displacement, and forms the same beam spot $E_P$ on the recording surface of a recording object during a recording operation. A laser light from a laser light source 53 is applied to the upper surface of the knife edge 11 or to the recording surface, its reflected light is detected by a detector 54, thereby detecting a position on the upper surface of the knife edge 11 or on the recording surface, adjusting the focus adjusting lens 48 in accordance with an output based on the detection signal and fed from the focus control unit 65, thus correctly forming the beam spot $E_P$ on the upper surface of the knife edge 11 or on the recording surface.

In the electron beam recording apparatus 100 described above, a beam displacement is measured prior to a recording operation. During such a measurement, the X-axis feeding stage 32 and the Y-axis feeding stage 33 are moved to effect a position adjustment so that the front end of the knife edge 11 (refer to FIG. 2) of the measuring device 10 becomes coincident with an emission axis of the electron gun 41. Further, using the vertical stage 37 makes it possible to perform another adjustment so that the upper surface level of the knife edge 11 becomes coincident with the recording surface of a recording object.

Moreover, during the emission of the electron beam E from the electron gun 41, the focus adjusting lens 48 is driven by an output from a focus adjusting unit 65, and the beam spot $E_P$ is formed at the upper surface level of the knife edge 11. Further, the alignment coil 46 is driven by an output based on an output signal of the feeding motor control unit 60 and fed from a beam position correcting unit 63, thereby setting an initial position for the electron beam E, so that the center of the beam spot $E_P$ becomes coincident with the front end position of the knife edge 11.

Then, once a measurement of a beam displacement is started, the driving circuit 16 will drive the deflecting coil 45 in accordance with a control signal fed from the measuring device 10, thereby controlling a reference position of the electron beam E in a manner such that the center of the beam spot $E_P$ will become coincident with the front end of the knife edge 11. At this time, since the control signal from the measuring device 10 is an output from which a changing frequency component has been cut off, even if the electron beam E has been controlled by virtue of the control output, there would not be any influence on a changing amount of the beam spot $E_P$. Moreover, since a deflection of the electron beam E is controlled to prevent a low frequency drift, it is possible to correctly and stably measure a beam displacement.

Moreover, as in a prior art, a beam displacement signal outputted from the measuring device 10 is inputted into an oscilloscope 71 and stored in a memory 72. During a recording operation, a correction signal is outputted from a correction signal generating unit 73 in accordance with the stored data of the memory 72. In a beam deflection control unit 64, by stacking the correction signal on the recording position signal, it is possible to perform an electron beam recording with a beam displacement corrected.

The features of the electron beam displacement measuring method, the electron beam displacement measuring device, and the electron beam recording apparatus according to the present invention can be concluded as follows (reference numerals correspond to FIGS. 2 to 4).

The electron beam displacement measuring method employs an electron beam recording apparatus 100 in which a beam spot $E_P$ of an electron beam E is converged on a recording surface to form a recording pattern on the recording surface. A knife edge 11 is disposed at an irradiating position of the beam spot $E_P$, an electron beam irradiating through the knife edge 11 is detected, and a displacement of the beam spot $E_P$ is measured in accordance with a change in a detected current when the center of the beam spot $E_P$ deviates from the front end of the knife edge. At this time, a reference position of the electron beam E is controlled during the measurement in a manner such that the center of the beam spot $E_P$ will be at the front end position of the knife edge 11. Further, the control of the reference position is performed in accordance with an output in which a changing frequency component of measurement subject has been removed from a detected current.

The electron beam displacement measuring device is a device which operates with an electron beam recording apparatus in which a beam spot $E_P$ of an electron beam E is converged on a recording surface to form a recording pattern on the recording surface, in a manner such that a displacement of an electron beam E is measured prior to a recording operation. The measuring device comprises a knife edge 11 disposed at an irradiating position of the beam spot $E_P$, detecting means (Farady cup 12 or the like) for detecting an electron beam E irradiating through the knife edge 11, filter means (high frequency cut filter 14 or the like) for removing a changing frequency component of measurement subject from an output of the detecting means, and control means 15 for controlling a reference position of the electron beam E in accordance with an output from the filter means, in a manner such that the center of the beam spot $E_P$ will be at the front end position of the knife edge 11. A displacement of the beam spot $E_P$ is measured in accordance with an output change of the detecting means when the center of the beam spot $E_P$ deviates from the front end of the knife edge 11.

The electron beam recording apparatus 100 operates to converge a beam spot of an electron beam E on a recording surface to form a recording pattern on the recording surface, and is provided with the above-described electron beam displacement measuring device for measuring a beam displacement prior to a recording operation.

According to the above features, when a beam displacement is measured prior to a recording operation, since a position of the beam spot $E_P$ constantly serving as a reference position is controlled in a manner such that the front end of the knife edge 11 will be at the center of the beam spot, it is possible to stably and correctly measure a beam displacement.

Further, since a reference position of the beam spot $E_P$ is controlled in accordance with a detected signal from which a changing frequency of measurement subject has been cut off, it is possible to prevent a large beam deviation having a low frequency in which the beam spot $E_P$ deviates from a measurement range during the measurement, without allowing the control of the reference position to affect a changing amount of measurement subject.

In this way, since it is possible to obtain correct beam displacement data, an electron beam recording apparatus can generate a correction signal at the time of recording in accordance with the data, effectively remove a beam displacement having a high degree influence on a high resolution recording, thereby ensuring a desired recording.

The invention claimed is:

1. An electron beam recording apparatus, in which a beam spot of an electron beam is converged on a recording surface to form a recording pattern on the recording surface, said recording apparatus, comprising:
   a beam deflection unit;
   a beam position correcting unit; and
   a measuring device for measuring a changing amount of a beam position when a beam displacement is measured prior to a recording operation performed by said recording apparatus,
   said measuring device comprises:
   a knife edge disposed at an irradiating position of the beam spot;
   detecting means for detecting an electron beam irradiating through the knife edge;
   a high frequency cut filter removing a changing frequency component of measurement subject from an output of the detecting means; and
   control means for controlling a reference position of the electron beam in accordance with an output from the filter so that the center of the beam spot is at the front end position of the knife edge, in which a displacement of the beam spot is measured in accordance with an output change of the detecting means when the center of the beam spot deviates from the front end of the knife edge, the control of the reference position is performed in accordance with an output in which a changing frequency component of measurement subject has been removed from the detected current.

2. An electron beam displacement measuring device for use in an electron beam recording apparatus, in which a beam spot of an electron beam is converged on a recording surface to form a recording pattern on the recording surface, said measuring device comprising:

the measuring device measuring a changing amount of a beam position when a beam displacement is measured prior to a recording operation performed by said recording apparatus, said recording apparatus comprising a beam deflection unit and a beam position correcting unit;

a knife edge disposed at an irradiating position of the beam spot;

detecting means for detecting an electron beam irradiating through the knife edge;

a high frequency cut filter removing a changing frequency component of measurement subject from an output of the detecting means; and control means for controlling a reference position of the electron beam in accordance with an output from the filter so that the center of the beam spot is at the front end position of the knife edge, in which a displacement of the beam spot is measured in accordance with an output change of the detecting means when the center of the beam spot deviates from the front end of the knife edge, the control of the reference position is performed in accordance with an output in which a changing frequency component of measurement subject has been removed from the detected current.

3. An electron beam displacement measuring method for use in an electron beam recording apparatus, in which a beam spot of an electron beam is converged on a recording surface to form a recording pattern on the recording surface, said method comprising:

disposing a knife edge of a measuring device at an irradiating position of the beam spot, the recording apparatus comprising the measuring device, a beam deflection unit and a beam position correcting unit;

detecting, by a detecting unit of the measuring device, an electron beam irradiating through the knife edge;

measuring, by the measuring device, a changing amount of a beam position when a beam displacement is measured prior to a recording operation performed by the recording apparatus;

removing, by a high frequency cut filter of the measuring device, a changing frequency component of measurement subject from an output of the detecting unit; and controlling, by a control unit of the measuring device, a reference position of the electron beam in accordance with an output from the filter so that the center of the beam spot is at the front end position of the knife edge, in which a displacement of the beam spot is measured in accordance with an output change in a detected current when a center of the beam spot deviates from a front end of the knife edge, the controlling of the reference position is performed in accordance with an output in which a changing frequency component of measurement subject has been removed from the detected current.

* * * * *